(12) United States Patent
Noda et al.

(10) Patent No.: US 10,777,972 B2
(45) Date of Patent: Sep. 15, 2020

(54) THERMAL RADIATION LIGHT SOURCE

(71) Applicant: KYOTO UNIVERSITY, Kyoto-shi, Kyoto (JP)

(72) Inventors: Susumu Noda, Kyoto (JP); Takuya Inoue, Kyoto (JP); Anqi Ji, Kyoto (JP); Takashi Asano, Kyoto (JP)

(73) Assignee: KYOTO UNIVERSITY, Kyoto-shi (JP)

( * ) Notice: Subject to any disclaimer, the term of this patent is extended or adjusted under 35 U.S.C. 154(b) by 0 days.

(21) Appl. No.: 16/080,528

(22) PCT Filed: Feb. 13, 2017

(86) PCT No.: PCT/JP2017/005160
§ 371 (c)(1),
(2) Date: Aug. 28, 2018

(87) PCT Pub. No.: WO2017/150160
PCT Pub. Date: Sep. 8, 2017

(65) Prior Publication Data
US 2019/0067910 A1  Feb. 28, 2019

(30) Foreign Application Priority Data
Feb. 29, 2016 (JP) .................................. 2016-037217

(51) Int. Cl.
*H01S 5/34* (2006.01)
*H01S 5/06* (2006.01)
(Continued)

(52) U.S. Cl.
CPC ............ *H01S 5/3402* (2013.01); *H01L 33/06* (2013.01); *H01S 5/0608* (2013.01); *H01S 5/105* (2013.01); *H01L 2933/0083* (2013.01)

(58) Field of Classification Search
CPC ...... H01S 5/3402; H01S 5/0608; H01S 5/105; H01S 5/0425; H01L 33/06; H01L 2933/0083
See application file for complete search history.

(56) References Cited

U.S. PATENT DOCUMENTS

2005/0029536 A1*  2/2005  Sugitatsu ............... B82Y 20/00
                                                        257/103
2005/0238310 A1* 10/2005  Hoshi ..................... H01S 5/426
                                                        385/129
(Continued)

FOREIGN PATENT DOCUMENTS

CN     103038959 A      4/2013
DE     112011102549 T5  5/2013
(Continued)

OTHER PUBLICATIONS

English Translation of JP2011-086853 (Year: 2011).*
(Continued)

*Primary Examiner* — Yuanda Zhang
(74) *Attorney, Agent, or Firm* — Oliff PLC

(57) ABSTRACT

A thermal radiation light source includes a laminated body including m quantum layers laminated where m is an integer of 2 or more, including an n-layer and a p-layer sandwiching the quantum layers from both sides in the laminating direction, the n-layer made of an n-type semiconductor and the p-layer made of a p-type semiconductor; a voltage applying unit for the m quantum layers is directly or indirectly connected to the n-layer and p-layer sandwiching each layer applying a voltage for moving to the n-layers or p-layers a charge; a voltage switching unit switches ON/OFF of application of the voltage to the m quantum layers; and a photonic crystal portion disposed in the laminated body or adjacent to the laminated body, so that lights of m wavelengths resonate,
(Continued)

the lights of the m wavelengths generated in the m quantum layers corresponding to transition energy between subbands in the quantum layer.

16 Claims, 8 Drawing Sheets

(51) Int. Cl.
*H01L 33/06* (2010.01)
*H01S 5/10* (2006.01)

(56) References Cited

U.S. PATENT DOCUMENTS

| | | | | |
|---|---|---|---|---|
| 2013/0056785 | A1* | 3/2013 | Hwang | H01L 27/15 257/99 |
| 2013/0121358 | A1 | 5/2013 | Hirose et al. | |
| 2017/0077675 | A1* | 3/2017 | Noda | H01S 5/18319 |

FOREIGN PATENT DOCUMENTS

| | | |
|---|---|---|
| EP | 3 113 304 A1 | 1/2017 |
| JP | 2003-298183 A | 10/2003 |
| JP | 2011-086853 A | 4/2011 |
| WO | 2012/014604 A1 | 2/2012 |
| WO | 2015/129668 A1 | 9/2015 |

OTHER PUBLICATIONS

De Zoysa, M. et al. "Investigation of Narrow-Band Thermal Emission From Intersubband Transitions in Quantum Wells". Journal of Applied Physics 118, pp. 103101-1-103101-5, 2015.

Inoue et al. "Electrical Tuning of Emissivity and Linewidth of Thermal Emission Spectra". Physical Review B 91, pp. 235316-1-235316-5, 2015.

Inoue et al. "Electrical Wavelength Switching of Thermal Emitters Based on Quantum Wells and Photonic Crystals". 2016 Conference On Lasers and Electro-Optics (CLEO). Optical Society of America, pp. 1-2, 2016.

Feb. 20, 2019 Extended Search Report issued in European Application No. 17759631.9.

Apr. 11, 2017 International Search Report issued in International Patent Application No. PCT/JP2017/005160.

Dec. 5, 2017 International Preliminary Report on Patentability issued on International Patent Application No. PCT/JP2017/005160.

Inoue et al; "Realization of dynamic thermal emission control;" Nature Materials; vol. 13; No. 10; pp. 928-931; Oct. 2014.

Nov. 19, 2019 Office Action issued in European Patent Application No. 17759631.9.

May 8, 2020 Office Action issued in European Patent Application No. 17759631.9.

\* cited by examiner

Fig. 1
(a)
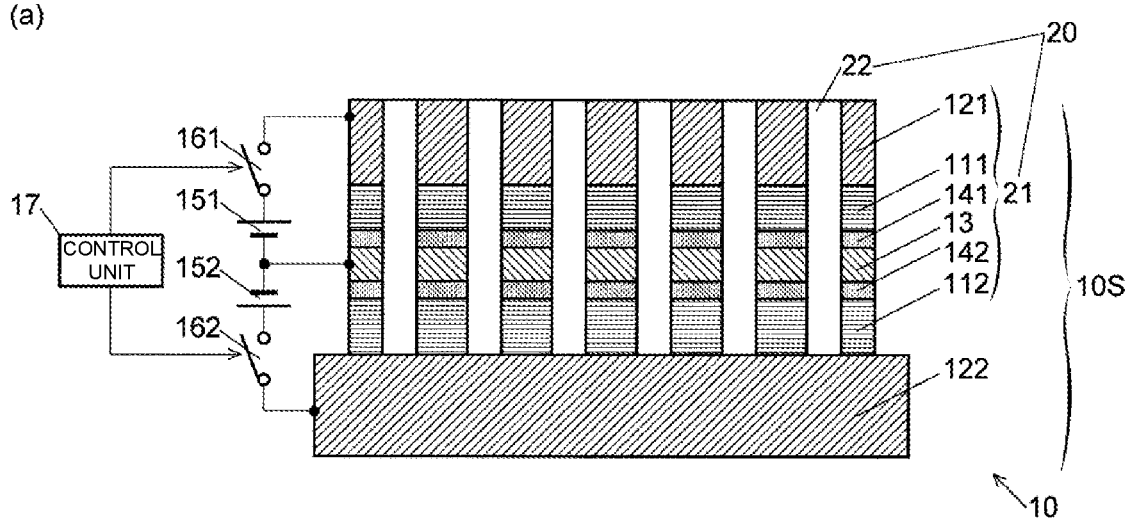
(b)
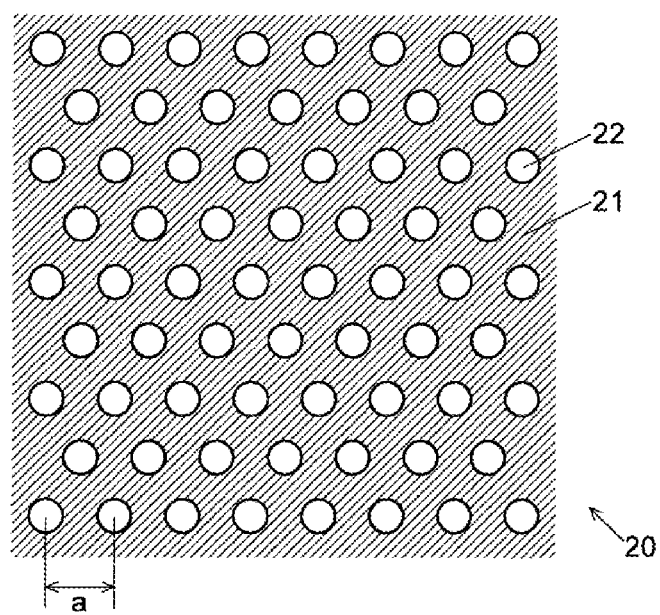

Fig. 3
(a) NO VOLTAGE APPLIED
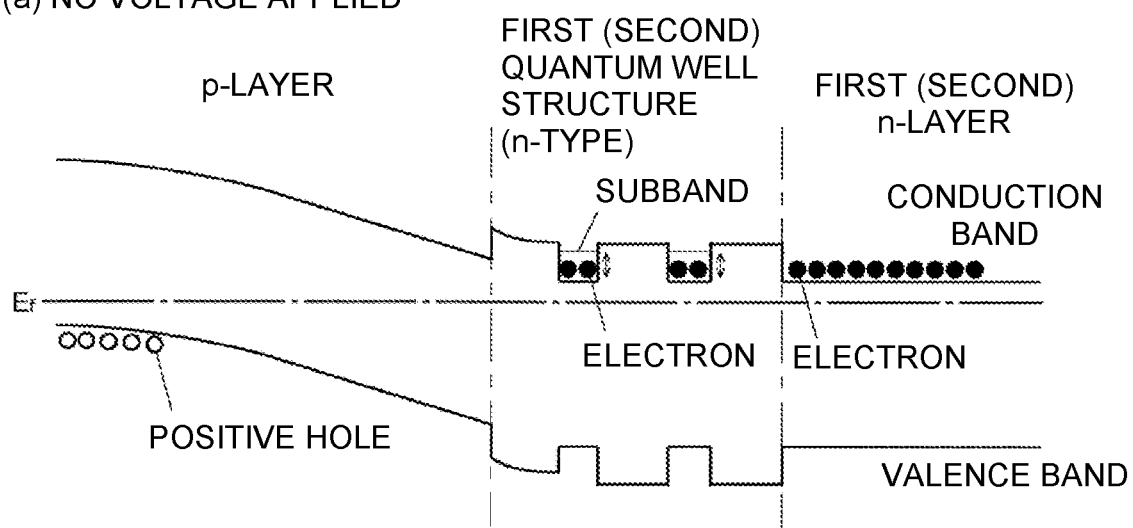
(b) VOLTAGE APPLIED
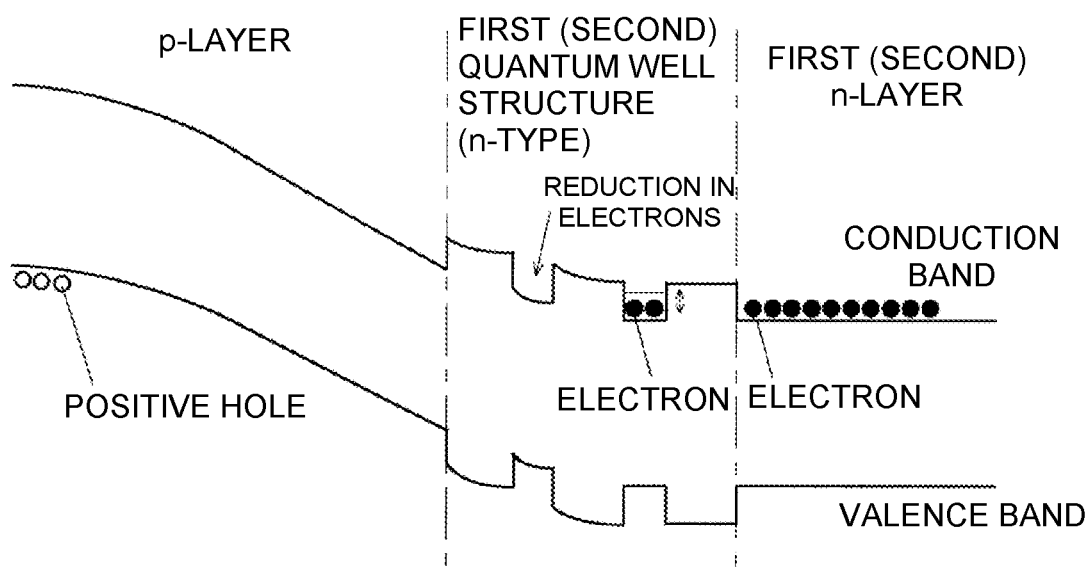

Fig. 8
(a)
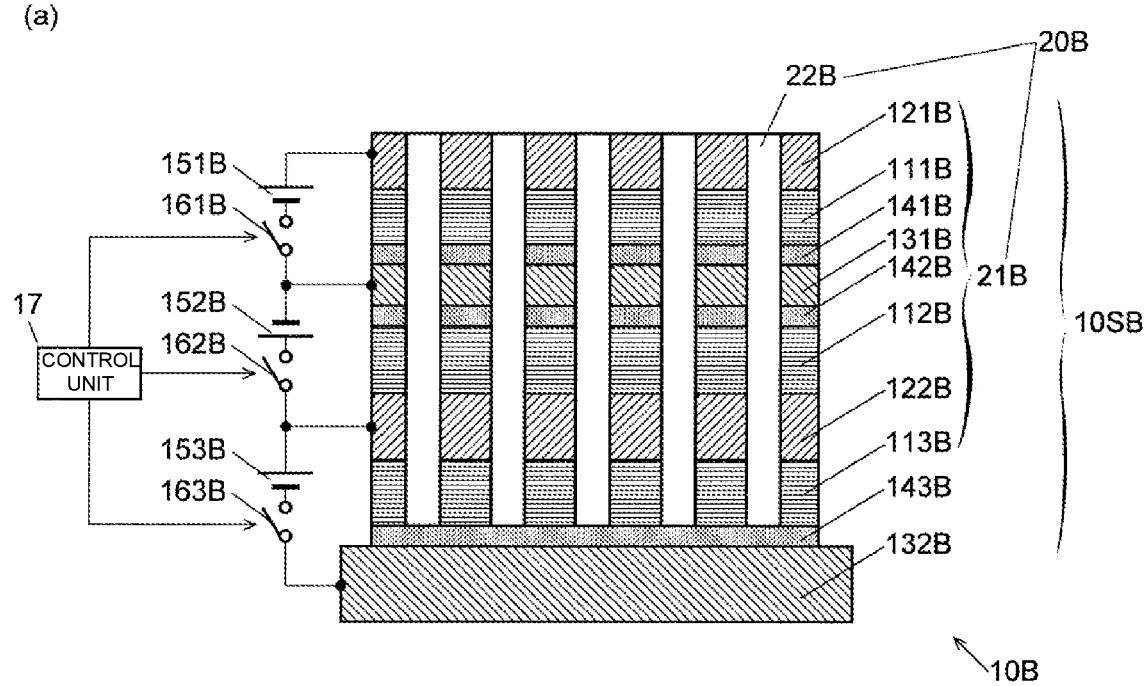
(b)
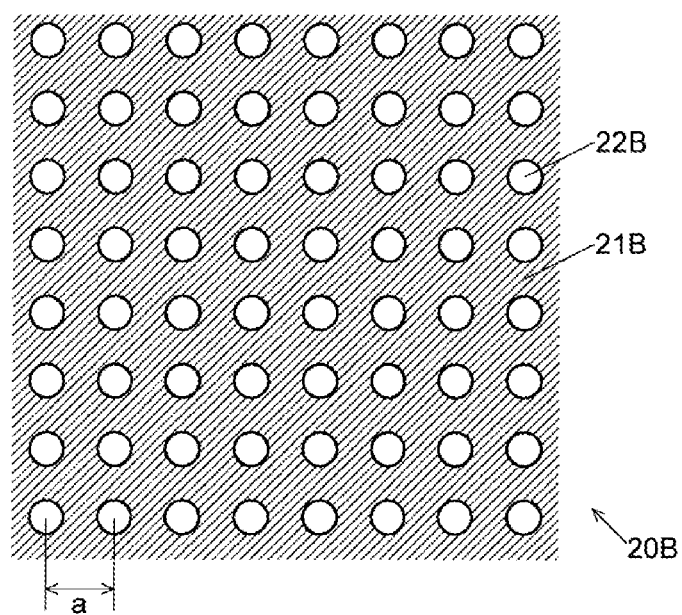

Fig. 10
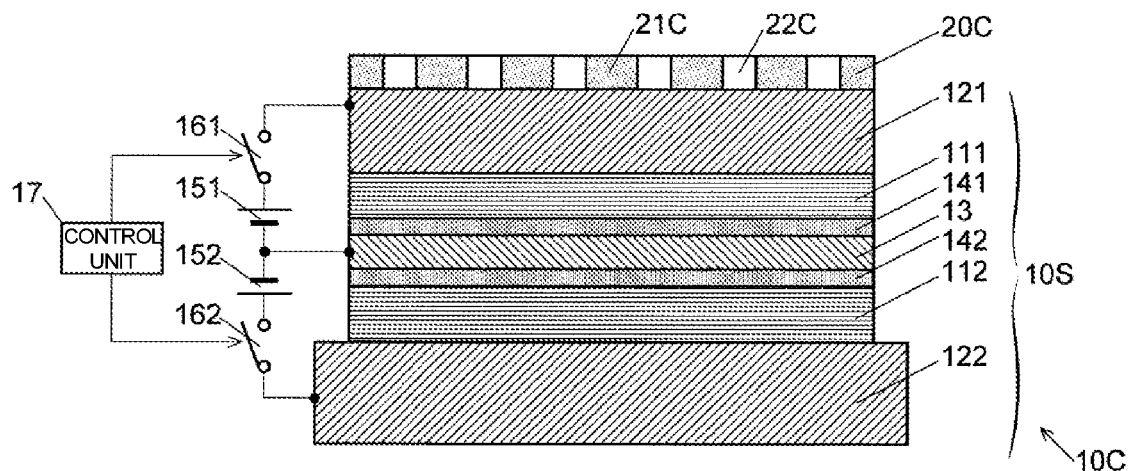
Fig. 11
(a)
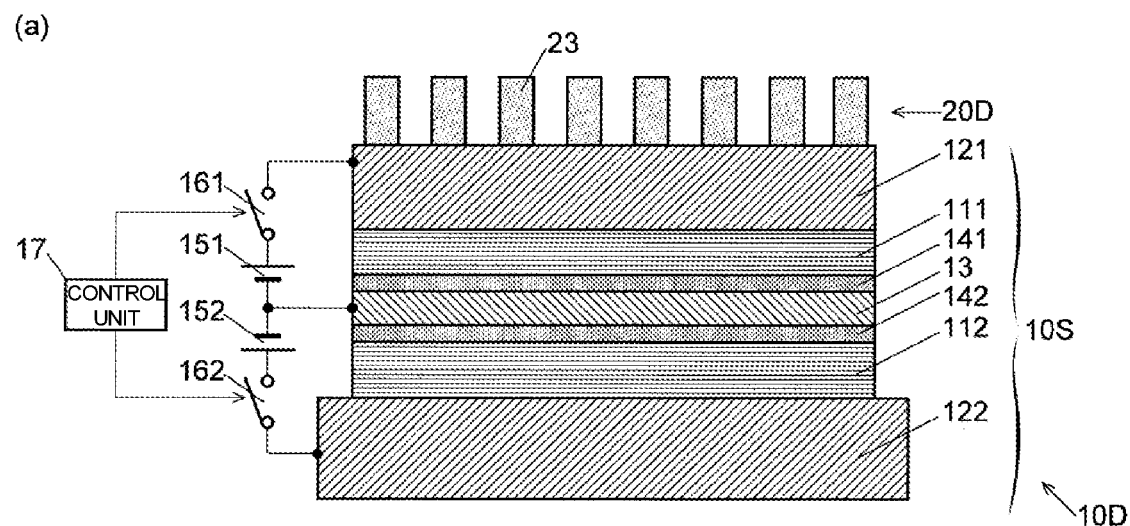
(b)
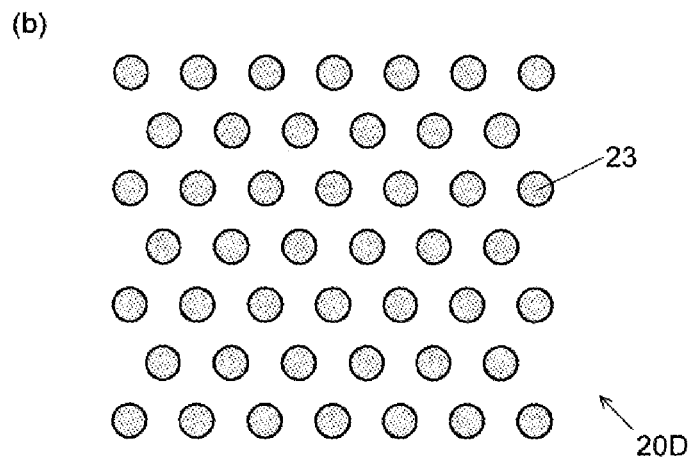

THERMAL RADIATION LIGHT SOURCE

TECHNICAL FIELD

The present invention relates to a thermal radiation light source. A thermal radiation light source is a device in which electromagnetic waves radiated by thermal radiation are used as the light source. This device can also be regarded as a heat-to-light converter which receives heat as the input and generates lights (electromagnetic waves) as the output. If this input of heat is imparted in the form of electromagnetic waves (infrared rays), the device can be regarded as a wavelength converter. It can also be regarded as a device for generating a thermal radiation by receiving electric energy as the input instead of heat. The term "thermal radiation light source" as used in the present application covers any of these devices.

BACKGROUND ART

Thermal radiation light sources have the advantage that an emission can be obtained by merely imparting heat to an object. For example, in a gas sensor for analyzing the components in an exhaust gas from an engine, the thermal radiation light source can be preferably used as a light source for converting waste heat produced by the engine into infrared rays for the sensing.

Electromagnetic waves emitted from an object which has been given heat have a spectrum spreading over a wavelength range dependent on the temperature. For example, electromagnetic waves generated by heating an object to a temperature of tens to hundreds of degrees Celsius have a wavelength range of a few µm to several tens of µm, and as the temperature rises, the range spreads to the shorter wavelength side. However, since the aforementioned infrared sensor normally utilizes only infrared rays of a specific one or more wavelengths, using such a thermal radiation light source causes the measurement target to be irradiated with infrared rays of unnecessary wavelengths other than the specific wavelength, which produces adverse effects, such as the heating of the measurement target. In the case of generating the thermal emission by supplying electric energy, using an emission source which generates a broadband emission causes the problem of an increase in the power consumption.

In order to solve such a problem, Patent Literature 1 has offered a thermal radiation light source including a quantum well structure in a photonic crystal. The photonic crystal includes a periodic refractive index distribution and is capable of forming a standing wave of light having a specific wavelength corresponding to the period. In the Patent Literature 1, the photonic crystal includes different refractive index regions (typically, holes) having a refractive index different from a refractive index of the substrate wherein the different refractive index regions are arranged on a plate member. By arranging the columnar members (different refractive index members) periodically on the base (in the air), it is possible to use parts on the base (air and different refractive index members) as a photonic crystal. A quantum well structure is the structure of an object in which an energy potential in the form of a well ("quantum well") is created by stacking a plurality of kinds of semiconductor layers with a thickness of approximately a few nm to a dozen nm, with each layer having a different magnitude of energy band gap.

In this thermal radiation light source, when heat is supplied from a heat source, a transition (intersubband transition) occurs between a plurality of discrete energy levels (subbands) formed in a quantum well having a quantum well structure. Light emission having a finite bandwidth centered on the wavelength corresponding to the transition energy occurs. In the photonic crystal provided with the quantum well structure, light having one wavelength determined by the period of the photonic crystal resonates and is amplified, and light having a wavelength spectrum having a sharp peak at the one wavelength is generated.

The thermal radiation light source further includes an electrode for applying a voltage to the quantum well structure. By turning ON/OFF the application of this voltage, the number of electrons or positive holes in the quantum well can be changed, whereby the intensity of the light having the specific wavelength can be controlled.

CITATION LIST

Patent Literature

Patent literature 1: WO 2015/129668

SUMMARY OF INVENTION

Technical Problem

For example, for the gas sensor for analyzing components in the exhaust gas of an engine, it is necessary to detect a plurality of gas components such as ammonia ($NH_3$) and nitrous oxide ($N_2O$). Since the absorption wavelength of infrared rays differs for each component to be detected (for example, 10.3 µm for ammonia and 7.7 µm for nitrous oxide), it is necessary to distinguish and detect lights of a plurality of wavelengths (infrared rays). Therefore, it is possible to detect the light of each wavelength by using a detector capable of identifying the wavelength after irradiating the sample (exhaust gas or the like) with the superimposed lights of the plurality of wavelengths. However, such detectors are expensive. On the other hand, if the sample is irradiated while switching the lights of the plurality of wavelengths at high speed one by one for the wavelengths, the light is detected for each wavelength by using an inexpensive detector which does not itself identify the wavelength. However, the thermal radiation light source described in Patent Literature 1 cannot be used for this purpose because only light of one wavelength is amplified.

An object of the present invention is to provide a thermal radiation light source capable of generating a plurality of wavelengths by switching the plurality of wavelengths one by one at a high speed.

Solution to Problem

According to the present invention made to solve the above problem, a thermal radiation light source includes a) a laminated body including m quantum well structure layers that are laminated, that each have a quantum well structure, and that have different magnitudes of transition energy between subbands respectively where m is an integer of 2 or more, and including an n-layer and a p-layer sandwiching each of the quantum well structure layers from both sides in the laminating direction wherein the n-layer is made of an n-type semiconductor and the p-layer is made of a p-type semiconductor;

b) a voltage applying unit that is provided for each of the m quantum well structure layers and is directly or indirectly connected to the n-layer and the p-layer sandwiching each quantum well structure layer and that applies a voltage for moving a charge in a quantum well of each quantum well structure layer to the n-layers or the p-layer;

c) a voltage switching unit that switches ON/OFF of application of the voltage to each of the m quantum well structure layers; and d) a photonic crystal portion disposed in the laminated body or adjacent to the laminated body, and including a periodic refractive index distribution having a single period so that lights of a total of m kinds of wavelengths resonate, each of the lights of the m wavelengths being generated in each of the m quantum well structure layers corresponding to transition energy between subbands in the quantum well of the quantum well structure layer.

Conventionally, in a thermal radiation light source using a photonic crystal, light of one wavelength is amplified based on resonance of a fundamental mode in a photonic crystal. However, in the photonic crystal, resonance in a higher-order mode can also occur, so that resonance in a fundamental mode and resonance of one or more higher-order modes (or resonance in a plurality of higher-order modes instead of a resonance in a fundamental mode) is used, whereby it is possible to resonate and amplify lights having a plurality of wavelengths. The values of the plurality of wavelengths depend on the period of the refractive index distribution. In addition, the values can be set by adjusting the size of the different refractive index region constituting the refractive index distribution or the size of the different refractive index member, or the thickness of the entire photonic crystal (Since the light spreads wider than the photonic crystal, the effective refractive index varies depending on the thickness of the photonic crystal).

Therefore, in the thermal radiation light source according to the present invention, m quantum well structure layers having different magnitudes of transition energy between the subbands in the quantum well are provided, and the present invention is made to utilize the fact that lights of a total of m kinds of wavelengths is generated one by one from one quantum well structure layer since the wavelength generated upon heating varies depending on the magnitude of the transition energy. That is, the photonic crystal portion is formed so that lights of m types of wavelengths resonates. As a result, light of a predetermined wavelength in the quantum well structure layer is generated from the quantum well structure layer to which voltage is not applied from the voltage applying unit by an operation of the voltage switching unit, and amplified in the photonic crystal portion. In contrast, in the quantum well structure layer to which voltage is applied, the charge in the quantum well moves to the n-layer or to the p-layer, so that the intensity of the light having the predetermined wavelength in the quantum well structure layer becomes weak. In this way, the intensities of lights can be controlled for lights of m kinds of wavelengths corresponding to the m quantum well structure layers.

According to the thermal radiation light source of the present invention, after heating the thermal radiation light source, by switching ON/OFF the application of the voltage to each of the m quantum well structure layers by using the voltage switching unit, light or lights including any one or a plurality of wavelengths out of the m kinds of wavelengths can be amplified in the photonic crystal portion and emitted. Since the wavelength of the emitted light can be switched by ON/OFF of the voltage, the response is fast and wavelength switching can be performed at high speed. For example, when the quantum well structure layers whose voltage is turned OFF are switched one by one, lights of m kinds of wavelengths is sequentially switched one by one for the wavelengths and emitted, so that it is possible to detect light for each wavelength using an inexpensive detector that does not discriminate the wavelength.

The photonic crystal portion may be provided in the laminated body or may be provided separately from the layers. However, it is desirable that the photonic crystal portion is provided so as to be integrated with the plurality of quantum well structure layers, the n-layer and the p-layer, so that a difference in distances to respective quantum well structure layers from the photonic crystal portion may not occur. For example, the photonic crystal portion may be constructed by the laminated body and holes, wherein the holes are provided in the laminating direction so as to penetrate the layers of the laminated body, and disposed periodically in a direction parallel to the quantum well structure layer, the n-layers and the p-layer.

The n-layer and the p-layer may be provided one for each quantum well structure layer. It is preferable that a common layer is used for adjacent quantum well structure layers. For example, it is possible to construct the laminated body so as to repeat a periodic arrangement of "an n-layer, a quantum well structure layer, a p-layer, and a quantum well structure layer". When a quantum well structure layer in which electrons are present in the quantum well is used, an i-layer made of an insulator may be provided between the quantum well structure layer and the p-layer, when a quantum well structure layer in which positive holes are present in the quantum well is used, an i-layer made of an insulator may be provided between the quantum well structure layer and the n-layer.

The voltage applying unit may be directly connected to the n-layer and the p-layer or indirectly connected to the n-layer or the p-layer. As an example in which the voltage applying unit is indirectly connected to the n-layer or the p-layer, the laminated body is constructed by a first semiconductor layer, a first quantum well structure layer which is the first one of the quantum well structure layer, a second semiconductor layer, a second quantum well structure layer which is the second one of the quantum well structure layer, and a third semiconductor layer in this order, wherein the first semiconductor layer and the third semiconductor layer are any one of the n-layer and the p-layer, and the second semiconductor layer is one of the n-layer and the p-layer different from the one that serves as the first semiconductor layer and the third semiconductor layer, and wherein the voltage applying unit is connected to the first semiconductor layer and the third semiconductor layer.

In a case where the first and third semiconductor layers are n-layers and the second semiconductor layer is a p-layer, when a voltage that makes the first semiconductor layer positive and the third semiconductor layer negative is applied between these layers, the charge in the quantum well of the first quantum well structure layer moves to the first semiconductor layer (n-layer) when the charge is an electron, and the charge moves to the second semiconductor layer (p-layer) when the charge is a positive hole, while the charge (in both cases of electrons and positive holes) in the quantum well of the second quantum well structure layer does not move to the second semiconductor layer or the third semiconductor layer (n-layer). On the other hand, when a voltage that makes the first semiconductor layer negative and the third semiconductor layer positive is applied between the two layers, the charge (the same as above) in the quantum well of the first quantum well structure layer does not move, while the charge in the quantum well of the second quantum well structure layer moves to the third semiconductor layer (in the case of electrons) or the second semiconductor layer (in the case of positive holes). In other words, from the viewpoint of the quantum well structure layer, if the layer having a higher potential is the n-layer among the adjacent semiconductor layers, the charge moves from the inside of the quantum well layer, and if the layer having a lower potential is the n-layer, the charge does not move from the inside of the quantum well layer.

As in the case where the first and third semiconductor layers are the p-layer and the second semiconductor layer is the n-layer, among the semiconductor layers adjacent to the quantum well structure layer, if the layer having a higher potential is the n-layer, the charge moves from the inside of the quantum well layer occurs, and if the layer having a lower potential is the n-layer, the charge does not move from the inside of the quantum well layer.

In addition to the first and second quantum well structure layers and the first to third semiconductor layers, the quantum well structure layer, the n-layer or the p-layer may be present.

A thermal radiation light source element according to the present invention includes:

a) a laminated body including m quantum well structure layers that are laminated, that have a quantum well structure, and that have different magnitudes of transition energy between subbands respectively where m is an integer of 2 or more, and including an p-layer and a p-layer sandwiching each of the quantum well structure layers in the laminating direction wherein the n-layer is made of an n-type semiconductor and the p-layer is made of a p-type semiconductor; and b) a photonic crystal portion disposed in the laminated body or adjacent to the laminated body, and including a periodic refractive index distribution having a single period so that lights of a total of m kinds of wavelengths resonate, each of the lights of the m wavelengths being generated in each of the m quantum well structure layers corresponding to transition energy.

Advantageous Effects of Invention

According to the present invention, it is possible to provide a thermal radiation light source capable of generating a plurality of wavelengths by switching the plurality of wavelengths one by one at a high speed.

BRIEF DESCRIPTION OF DRAWINGS

FIG. 1 is (a) a longitudinal sectional view and (b) a top view showing a first embodiment of a thermal radiation light source according to the present invention.

FIG. 3 is a diagram showing an energy state of electrons of an n-layer, a quantum well structure layer and a p-layer in (a) a state where no voltage is applied between the electrodes and (b) a state where a voltage is applied.

FIG. 8 is a longitudinal sectional view (a) and a top view (b) showing a second embodiment of a thermal radiation light source according to the present invention.

FIG. 10 is a longitudinal sectional view showing an example of a thermal radiation light source which is provided with a photonic crystal portion outside a laminated body.

FIG. 11 is a longitudinal sectional view (a) showing another example of a thermal radiation light source provided with a photonic crystal portion outside the laminated body and a top view of the photonic crystal portion (b).

DESCRIPTION OF EMBODIMENTS

Figure 2:
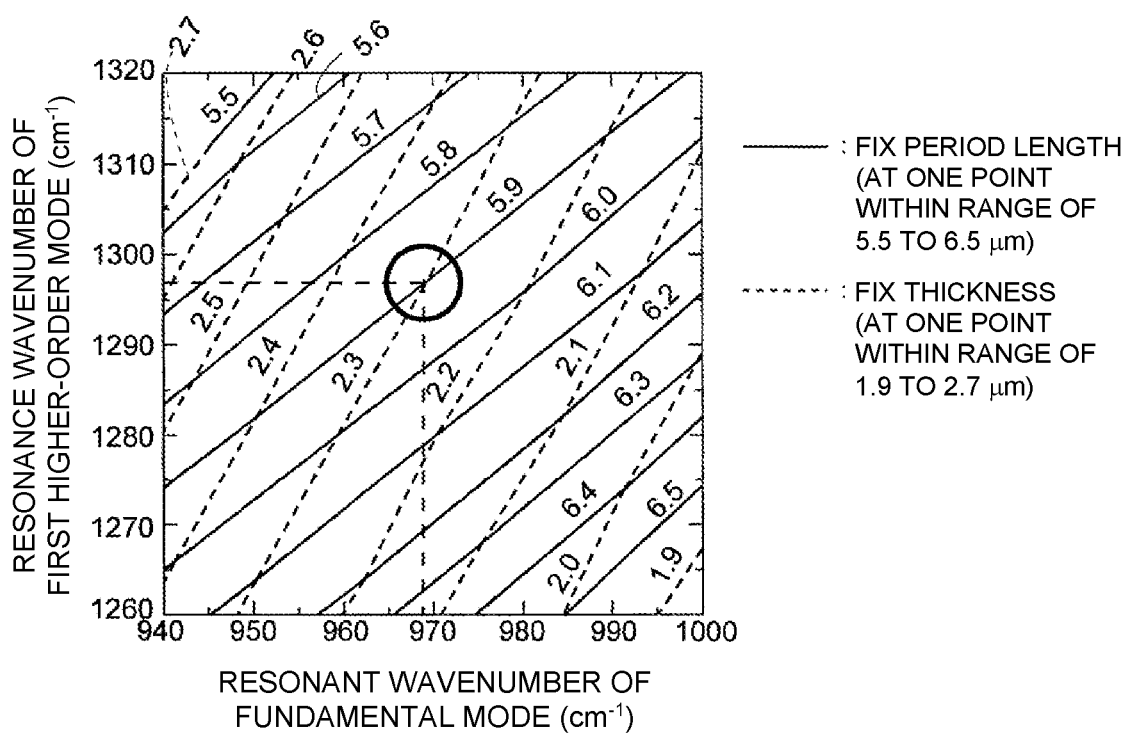
FIG. 2 is a graph showing calculation results regarding the relationship between the resonance wavenumbers of a fundamental mode and a first higher-order mode in the photonic crystal portion with respect to the case where the period length of holes is constant and the case where the thickness of a base material is constant.

Embodiments of the thermal radiation light source according to the present invention are described using FIGS. 1 to 11.

(1) First Embodiment of the Thermal Radiation Light Source According to the Present Invention (1-1) Configuration of Thermal Radiation Light Source of the First Embodiment FIG. 1 shows a first embodiment of a thermal radiation light source according to the present invention. This thermal radiation light source 10 includes a first quantum well structure layer 111 and a second quantum well structure layer 112 spaced apart from each other in parallel, a p-layer 13 sandwiched between the first quantum well structure layer 111 and the second quantum well structure layer 112, a first n-layer 121 disposed on the first quantum well structure layer 111 and remote from the p-layer 13, and a second n-layer 122 disposed on the second quantum well structure layer 112 and remote from the p-layer 13. In addition, a first i-layer 141 is disposed between the first quantum well structure layer 111 and the p-layer 13, and a second i-layer 142 is disposed between the second quantum well structure layer 112 and the p-layer 13. That is, a laminated body 10S is constructed by the first n-layer 121, the first quantum well structure layer 111, the first i-layer 141, the p-layer 13, the second i-layer 142, the second quantum well structure layer 112, and the second n-layer 122 in this order.

Both the first quantum well structure layer 111 and the second quantum well structure layer 112 has a structure in which a plurality of GaAs layers made of GaAs and not doped with a charge, and a plurality of AlGaAs layers made of $Al_{0.34}Ga_{0.66}As$ with x=0.66 of $Al_{1-x}Ga_xAs$ and doped with an electron at a density of $1\times10^{17}$ cm$^{-3}$ are alternately laminated. In the first quantum well structure layer 111 and the second quantum well structure layer 112, since the band gaps of GaAs and $Al_{0.34}Ga_{0.66}As$ are overlapped and GaAs has a smaller band gap than that of $Al_{0.34}Ga_{0.66}As$, a quantum well is formed with the GaAs as the bottom, and electrons are captured in GaAs and a subband is formed in GaAs. The energy of the subband depends on the thickness of the GaAs layer and the composition ratio of Al in the AlGaAs layer. The thickness of the GaAs layer is, about 5.943 nm which corresponds to 21 periods (one period corresponds to about 0.283 nm) of the crystal structure in the first quantum well structure layer 111, and about 7.924 nm which corresponds to 28 periods of the crystal structure in the second quantum well structure layer 112. Due to the difference in the subband energy based on the difference in thickness of the GaAs layer, lights with different wavelengths are generated in the first quantum well structure layer 111 and the second quantum well structure layer 112 upon heating. In terms of design, these wavelengths are about 7.7 μm (same as the absorption wavelength of nitrous oxide) in the first quantum well structure layer 111 and 10.3 μm (the same as the absorption wavelength of ammonia) in the second quantum well structure layer 112. The entire thickness of the first quantum well structure layer 111 is 278 nm and the entire thickness of the second quantum well structure layer 112 is 306 nm.

The first quantum well structure layer 111 and the second quantum well structure layer 112 are not limited to those comprising a GaAs layer and an AlGaAs layer. For example, a quantum well structure layer made of a nitride semiconductor may be used. Examples of a quantum well structure layer made of a nitride semiconductor include layers made of GaN and doped with electrons and layers made of $Al_{1-x}Ga_xN$ (0<x<1) which are alternately laminated. By using $GaN/Al_{1-x}Ga_xN$ for the quantum well structure layer, the heating temperature can be increased to at least about 600° C., thereby increasing the light output and increasing the selection range of the wavelengths. The larger the value of the number (1-x) of Al atoms per Ga atom in the AlGaN layer (the smaller the value of x), the larger the difference in magnitude of the band gap between AlGaN and GaN, so that thermal radiation with the shorter wavelength occurs.

The p-layer 13 is made of a p-type semiconductor, and the first n-layer 121 and the second n-layer 122 are made of an n-type semiconductor. In the present embodiment, GaAs doped with positive holes at a density of $2 \times 10^{17}$ cm$^{-3}$ is used for the p-type semiconductor, and GaAs doped with electrons at a density of $1 \times 10^{17}$ cm$^{-3}$ is used for the n-type semiconductor. The thickness is 200 nm for the p-layer 13, 500 nm for the first n-layer 121, and 650 nm for the second n-layer 122.

GaAs which is an undoped intrinsic semiconductor is used for the first i-layer 141 and the second i-layer 142. Note that the first i-layer 141 and the second i-layer 142 are provided to adjust the electric capacity of the laminated body 10S. The electric capacity of the laminated body 10S is a physical quantity which governs the operation speed of the thermal radiation light source and the electric resistances of the n-type semiconductor and the p-type semiconductor. The smaller the electric capacity and the electric resistance, the faster the operation speed. As the thickness of the first i-layer 141 and the second i-layer 142 increases, the electric capacity of the laminated body 10S decreases to contribute to increase the operating speed, whereas the electric resistance increases to contribute to decrease the operating speed. Therefore, from the viewpoint of operating speed, it is preferable that the thickness of the first i-layer 141 and the second i-layer 142 is as thick as possible. However, as the thickness is increased, the voltage value required for intensity modulation of the light increases. Therefore, it is desirable to determine the thickness of the first i-layer 141 and the second i-layer 142 in consideration of these operating speed and voltage value. In addition, the first i-layer 141 and the second i-layer 142 are not indispensable in the thermal radiation light source of the present invention and may be omitted.

The positive electrode of a first power supply 151 is connected to the first n-layer 121 via a first switch 161 and the positive electrode of a second power supply 152 is connected to the second n-layer 122 via a second switch 162. The p-layer 13 is connected to the negative electrode of the first power supply 151 and the negative electrode of the second power supply 152. The first switch 161 and the second switch 162 are connected to a control unit 17 that controls opening and closing (ON/OFF) thereof. The first power supply 151 and the second power supply 152 correspond to the voltage applying unit, and the first switch 161, the second switch 162, and the control unit 17 correspond to the voltage switching unit.

Cylindrical holes 22 (different refractive index regions) are provided so as to penetrate the respective layers except for the second n-layer 122 in the laminated body 10S. The holes 22 extend perpendicularly with respect to the respective layers of the laminated body 10S, and are disposed periodically in a direction parallel to each layer. When viewed in a direction perpendicular to each layer, the holes 22 are disposed in a triangular lattice pattern, the period length a is 5.9 μm, and the radius r of each hole 22 is 0.27a (about 1.59 μm). In this way, a photonic crystal portion 20 is formed of the hole 22 and the portion excluding the second n-layer 122 of the laminated body 10S (the portion is referred to as "base material 21").

As will be described below, this photonic crystal portion 20 is designed such that light whose wavelength is about 7.7 μm which is the same as the emission wavelength of the first quantum well structure layer 111, and light whose wavelength is about 10.3 μm which is the same as the emission wavelength of the second quantum well structure layer 112 resonate.

The resonance wavelength in the photonic crystal portion 20 depends on the period length a at which the holes 22 are disposed and the effective refractive index of the light in the photonic crystal portion 20. The effective refractive index is determined by the refractive index of each layer constituting the base material 21, the refractive index of the holes 22 (air), the ratio of the holes 22 in the photonic crystal portion 20, and the thickness of the laminated body 10S. Here, as the thickness of the laminated body 10S becomes decreases, the ratio of the electric field of the light resonating in the photonic crystal portion 20 exuding into the air outside the laminated body 10S increases, so that the thickness affects the effective refractive index. In this embodiment, since any materials of the base material 21 are of GaAs type (including AlGaAs), the refractive indexes of the respective layers constituting the base material 21 can be regarded as substantially the same.

Therefore, the relation between the resonance wavenumber of the fundamental mode and the resonant wavenumber of the first higher-order mode has been obtained by calculation for each of (i) a case where the period length of the holes 22 is fixed, and (ii) a case where the thickness of the laminated body 10S is constant, in the photonic crystal portion 20. The results are shown in the graph of FIG. 2. In FIG. 2, the case (i) is indicated by a solid line, and the case (ii) is indicated by a broken line. In the case (i), the calculation with the period length fixed to one value within the range of 5.5 to 6.5 μm has been performed for eleven period lengths. In the case (ii), the calculation with the thickness fixed to one value within the range of 1.9 to 2.7 μm has been performed for nine thicknesses. The points where the solid line of the case (i) and the broken line of the case (ii) intersect on the graph show that the value of the horizontal axis represents the resonance wavenumber of the fundamental mode, and the value of the vertical axis represents the resonance wavenumber of the first higher-order mode in the photonic crystal portion 20 having a thickness corresponding to the solid line and a period length corresponding to the broken line. As seen from the point enclosed by a circle in FIG. 2, when the photonic crystal portion 20 has a period length of about 5.9 μm and a thickness of the laminated body 10S of about 2.3 μm, the resonance wavenumber of the fundamental mode is about 970 cm$^{-1}$, and the resonance wavenumber of the first higher-order mode is about 1300 cm$^{-1}$. The resonance wavelengths corresponding to these resonance wavenumbers are $\lambda_2$ (about 10.3 μm) in the fundamental mode and $\lambda_1$ (about 7.7 μm) in the first higher-order mode, and the resonance wavelengths coincide with the emission wavelengths of the second quantum well structure layer 112 and the first quantum well structure layer 111 described above.

(1-2) Operation of the Thermal Radiation Light Source of the First Embodiment

The operation of the thermal radiation light source 10 of the present embodiment will be described. When the thermal radiation light source 10 is heated while both the first switch 161 and the second switch 162 are OFF, in the first quantum well structure layer 111 and the second quantum well structure layer 112, electrons transition between subbands formed in the quantum well, light having a wavelength corresponding to the transition energy is generated (FIG. 3(*a*)). At this time, the first quantum well structure layer 111 emits lights within a finite bandwidth centered on the wavelength $\lambda_1$, and the second quantum well structure layer 112 emits lights within a finite bandwidth centered on the wavelength $\lambda_2$. Among these lights, only the lights with the wavelengths $\lambda_1$ and $\lambda_2$, which are the resonance wavelengths of the photonic crystal portion 20, resonate and are amplified in the photonic crystal portion 20 and are emitted to the outside of the thermal radiation light source 10.

When the first switch 161 is switched from OFF to ON while the second switch remains OFF, in the first quantum well structure layer 111, the dopant electrons move to the first n-layer 121, and the number of electrons in the quantum well decreases (FIG. 3(*b*)). As a result, the intensity of the light from the first quantum well structure layer 111 decreases, and the intensity of the light having the wavelength $\lambda_1$ resonating and amplified in the photonic crystal portion 20, and emitted to the outside of the thermal radiation light source 10 also decreases. In contrast, in the second quantum well structure layer 112, since the second switch remains OFF, light emission with a finite bandwidth centering on the wavelength $\lambda_2$ occurs. Therefore, the light having the wavelength $\lambda_2$ resonates and is amplified in the photonic crystal portion 20, and is emitted to the outside of the thermal radiation light source 10.

For the same reason, when the first switch 161 is turned OFF, and the second switch 162 is turned ON, the intensity of the light having the wavelength $\lambda_2$ decreases, and the light having the wavelength $\lambda_1$ is amplified in the photonic crystal portion 20 and emitted to the outside of the thermal radiation light source 10.

As described above, one of the first switch 161 and the second switch 162 is turned ON and the other is turned OFF, thereby selectively emitting the light with the wavelength $\lambda_1$ and the light with the wavelength $\lambda_2$ to the outside of the thermal radiation light source 10.

Figure 4:
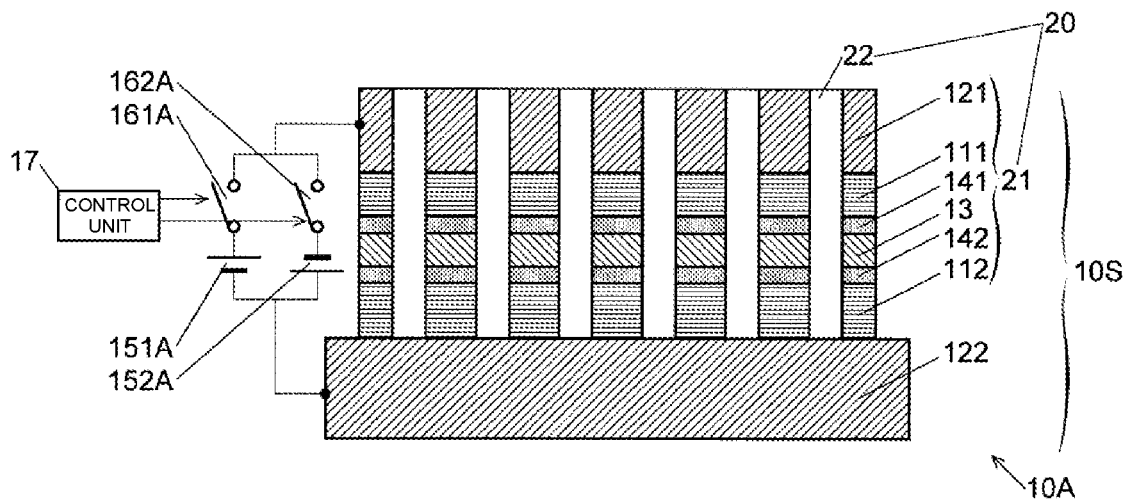
FIG. 4 is a longitudinal sectional view showing a modification of the thermal radiation light source of the first embodiment.

(1-3) Modification of the Thermal Radiation Light Source of the First Embodiment A modification of the thermal radiation light source of the first embodiment will be described with reference to FIG. 4. This thermal radiation light source 10A has the same configuration as the thermal radiation light source 10 of the first embodiment with respect to the laminated body 10S and the photonic crystal portion 20. A first power supply 151A and a first switch 161A connected in series to the first power supply 151A, and a second power supply 152A and a second switch 162A connected in series to the second power supply 152A are provided in parallel, and they are connected to the first n-layer 121 and the second n-layer 122. The first power supply 151A is provided so that the first n-layer 121 side corresponds to a positive electrode and the second power supply 152A is provided so that the second n-layer 122 side corresponds to a positive electrode. Although no power supply is directly connected to the p-layer 13, in terms of voltage application to the first quantum well structure layer 111, the p-layer 13 is indirectly connected to the first power supply 151A and the second power supply 152A via the second n-layer 122, the second quantum well structure layer 112 and the second i-layer 142. The same applies to voltage application to the second quantum well structure layer 112.

In the thermal radiation light source 10A, when the first switch 161A is turned ON and the second switch 162A is turned OFF in a heated state, dopant electrons in the first quantum well structure layer 111 move to the first n-layer 121, whereas dopant electrons in the second quantum well structure layer 112 do not move. Therefore, by the same reason as in the above-described thermal radiation light source 10, only the light having the wavelength $\lambda_2$ is selectively emitted to the outside of the thermal radiation light source 10A. Similarly, when the first switch 161A is turned OFF and the second switch 162A is turned ON, only the light with the wavelength $\lambda_1$ is selectively emitted to the outside of the thermal radiation light source 10A.

In addition, in the thermal radiation light sources 10 and 10A, one or both of the first quantum well structure layer 111 and the second quantum well structure layer 112 may be doped with positive holes in place of electrons. In this case, the polarities of the first power supply 151 and the second power supply 152 in the thermal radiation light source 10 are the same as those in the above example. In addition, as in the thermal radiation light sources 10 and 10A or as in the above, when one or both of the two quantum well structure layers are doped with positive holes, a layer made of a p-type semiconductor may be used instead of the first n-layer 121 and the second n-layer 122, and a layer made of an n-type semiconductor may be used instead of the p-layer 13. In this case, in the thermal radiation light source 10, the polarities of the first power supply 151 and the second power supply 152 are set opposite to those in the above example.

Figure 5:
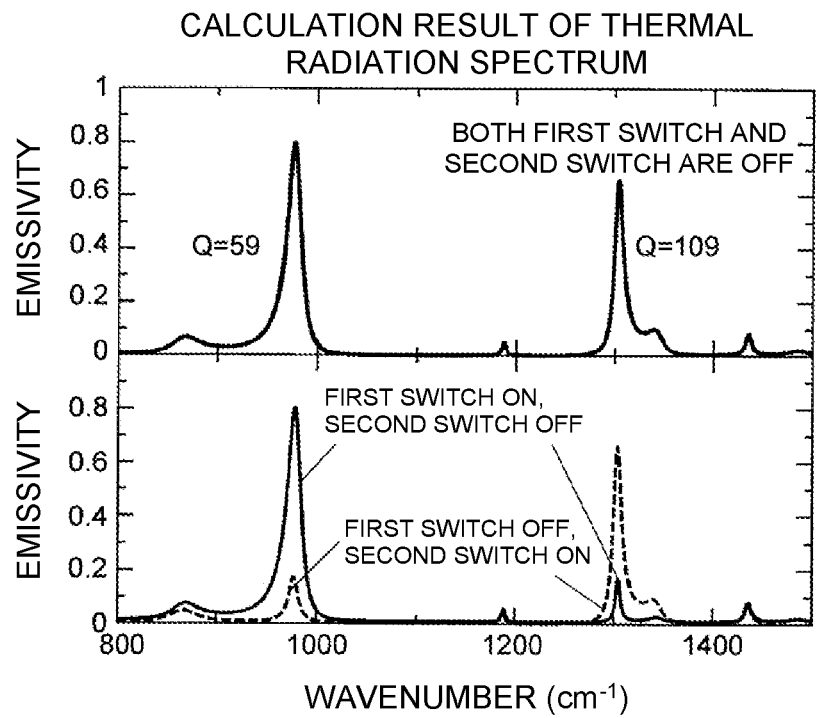
FIG. 5 is a graph showing calculation results regarding thermal radiation spectrum of the thermal radiation light source of the first embodiment.

(1-4) Calculation Results and Measurement Results Relating to the Thermal Radiation Light Source of the First Embodiment FIG. 5 is a graph showing the calculation results regarding thermal radiation spectrum of the thermal radiation light source 10 of the first embodiment obtained in the direction perpendicular to the plane. The vertical axis of the graph indicates emissivity which is the value obtained by normalizing the thermal radiation intensity of the light source with the blackbody radiation intensity at the same temperature. When both the first switch 161 and the second switch 162 are OFF, peaks are observed at wavenumbers of about 1300 cm$^{-1}$ (corresponding to the resonance wavelength $\lambda_1$) and about 970 cm$^{-1}$ (corresponding to the resonance wavelength $\lambda_2$). On the other hand, when the first switch 161 is turned ON, the peak intensity at the wavenumber of about 1300 cm$^{-1}$ decreases, and when the second switch 162 is turned ON, the peak intensity at the wavenumber of about 970 cm$^{-1}$ decreases. This result is as described above.

Figure 6:
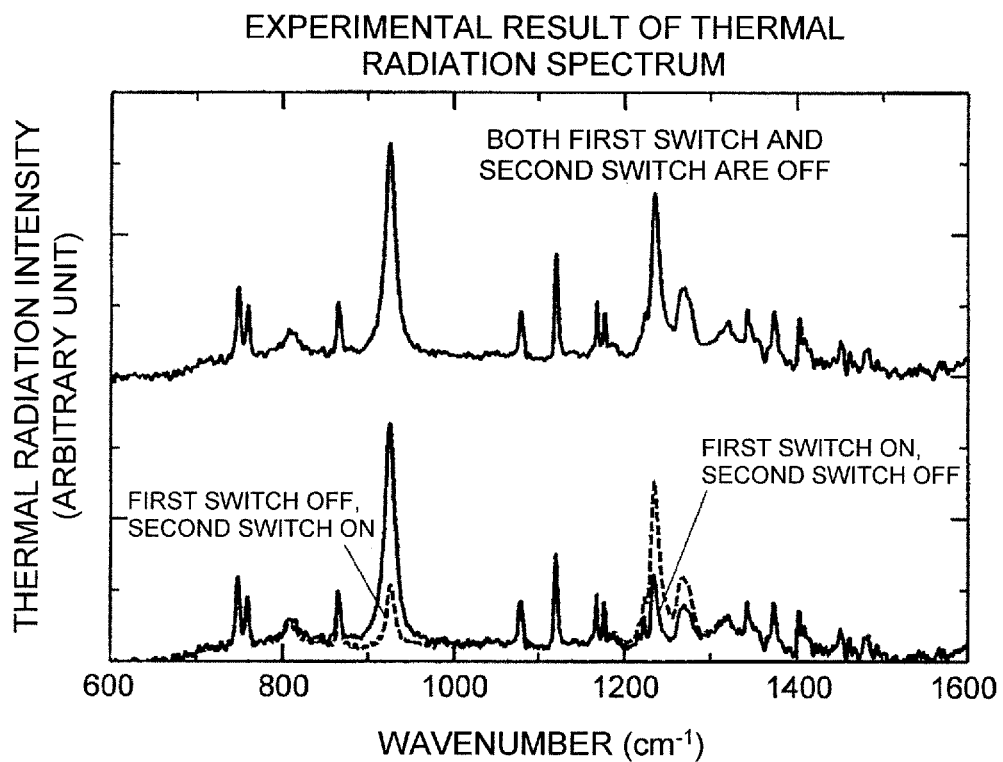
FIG. 6 is a graph showing a result of measuring a thermal radiation spectrum using the thermal radiation light source of the modification of the first embodiment.

FIG. 6 shows the experimental results regarding thermal radiation spectrum. Here, the thermal radiation light source 10A of the modification was used, and the lattice constant of a photonic crystal portion 20 was set to 6.2 µm. In the experiment, since radiation with an angle deviated from a direction perpendicular to the plane was also collected, a plurality of small peaks other than the peaks at wavenumbers of about 1300 cm$^{-1}$ and about 970 cm$^{-1}$ were observed. However, the peak intensities at the above two wavenumbers (two wavelengths) varied with voltage, and measurement results corresponding to the calculation results were obtained.

Figure 7:
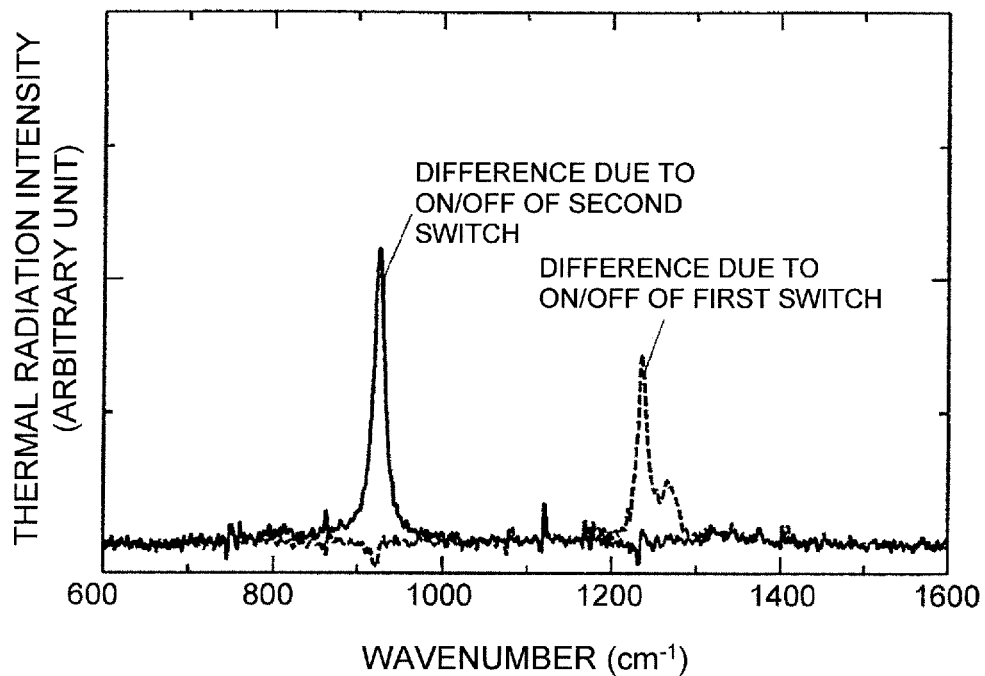
FIG. 7 is a graph showing the result of subtracting the measurement results regarding thermal radiation spectrum when only either the first switch or the second switch is ON from the measurement result of thermal radiation spectrum when both the first switch and the second switch are OFF

With respect to the experimental results, FIG. 7 shows a result (i) in which data when the first switch 161 was ON and the second switch was OFF is subtracted from data when both the first switch and the second switch were OFF and a result (ii) in which data when the first switch 161 was OFF and the second switch was ON is subtracted from data when both the first switch and the second switch were OFF. In FIG. 7, a plurality of small peaks at wavenumbers apart from the above two wavenumbers are substantially subtracted, and light emission from the quantum well structure layer where the switch is OFF is also subtracted to be substantially zero. What appears as peaks in FIG. 7 is a difference as a result of a decrease in peak intensity at a wavenumber of about 1300 cm$^{-1}$ when the first switch 161 is turned ON and a difference as a result of a decrease in peak intensity at a wavenumber of about 970 cm$^{-1}$ when the second switch 162 is turned ON.

Also when this thermal radiation light source 10A is used as a light source of a sensor, by subtracting the value obtained when the switch is ON (weak light emission) from the value obtained when the switch is OFF (strong light emission) with respect to the data obtained by a detector, peaks in other bands can be removed.

(2) Second Embodiment of the Thermal Radiation Light Source According to the Present Invention (2-1) Configuration of Thermal Radiation Light Source of the Second Embodiment A configuration of the thermal radiation light source of the second embodiment will be described with reference to FIG. 8. A thermal radiation light source 10B has a laminated body 10SB that is constructed by a first quantum well structure layer 111B, a second quantum well structure layer 112B and a third quantum well structure layer 113B all of which have a quantum well structure, a first n-layer 121B and a second n-layer 122B made of an n-type semiconductor, a first p-layer 131B and a second p-layer 132B made of a p-type semiconductor, and a first i-layer 141B, a second i-layer 142B, and a third i-layer 143B made of an intrinsic semiconductor, the layers being provided in parallel. The stacking order (and thickness) of the respective layers in the laminated body 10SB is the first n-layer 121B (200 nm), the first quantum well structure layer 111B (280 nm), the first i-layer 141B (150 nm), the first p-layer 131B (200 nm), the second i-layer 142B (150 nm), the second quantum well structure layer 112B (306 nm), the second n-layer 122B (200 nm), the third quantum well structure layer 113B (263 nm), the third i-layer 143B (150 nm), and the second p-layer 132B (200 nm). The structure of the quantum well structure and materials of the p-type semiconductor, the n-type semiconductor and the intrinsic semiconductor are the same as those of the first embodiment. The density of the dopant positive holes in the p-type semiconductor and the density of the dopant electrons in the n-type semiconductor are both $2 \times 10^{17}$ cm$^{-3}$.

The thicknesses of the GaAs layer in the three quantum well structure layers are about 6.226 nm corresponding to 22 periods of the crystal structure in the first quantum well structure layer 111B, about 7.924 nm corresponding to 28 periods in the second quantum well structure layer 112B, and about 4.811 nm corresponding to 17 periods in the third quantum well structure layer 113B. As a result, upon heating, a light having a wavenumber of about 1250 cm$^{-1}$ (wavelength of about 8.0 µm) in the first quantum well structure layer 111B, a wavenumber of about 970 cm$^{-1}$ (wavelength of about 10.3 µm) in the second quantum well structure layer 112B, and a wavenumber of about 1500 cm$^{-1}$ (wavelength of about 6.7 µm) in the third quantum well structure layer 113B is generated.

Cylindrical holes 22B are provided perpendicularly to the respective layers so as to penetrate the respective layers except for the second p-layer 132B and the third i-layer 143B in the laminated body 10SB. When viewed in a direction perpendicular to each layer, the holes 22B are disposed in a square lattice pattern, the period length a is 4.8 µm, and the radius r of each hole 22 is 0.28a (about 1.34 µm). In this way, a photonic crystal portion 20B is formed of the holes 22B and a portion excluding the second p-layer 132B and the third i-layer 143B in the laminated body 10SB (the portion is referred to as base material 21B).

In addition, a first power supply 151B, a second power supply 152B, and a third power supply 153B are provided corresponding to the first quantum well structure layer 111B, the second quantum well structure layer 112B and the third quantum well structure layer 113B so that a voltage is applied to the respective layers. Each power supply is connected to the p-layer and the n-layer sandwiching the quantum well structure layer. In addition, a first switch 161B, a second switch 162B, and a third switch 163B are provided corresponding to the first power supply 151B, the second power supply 152B, and the third power supply 153B. The first switch 161B, the second switch 162B, and the third switch 163B can be turned ON and OFF independently.

(2-2) Operation of the Thermal Radiation Light Source of the Second Embodiment

The operation of the thermal radiation light source 10B of the present embodiment will be described. When the thermal radiation light source 10B is heated in a state where the first switch 161B to the third switch 163B are all OFF, light emission with a finite bandwidth centered on the wavelengths $\lambda_1$, $\lambda_2$ and $\lambda_3$ occurs corresponding to the transition energy in the subband of the quantum well of each quantum well structure layer in the first quantum well structure layer 111B, the second quantum well structure layer 112B, and the third quantum well structure layer 113B. Light emission centered on these three wavelengths is guided in a mixed state into the photonic crystal portion 20B. Only lights with wavelengths $\lambda_1$, $\lambda_2$, and $\lambda_3$ resonate and are amplified in the photonic crystal portion 20B, and are emitted to the outside of the thermal radiation light source 10B.

When the first switch 161B is turned ON, since the dopant electrons in the first quantum well structure layer 111B move to the first n-layer 121B, and the number of electrons in the quantum well decreases, the intensity of the light having the wavelength $\lambda_1$ guided into the photonic crystal portion 20B decreases. As a result, the intensity of light with the wavelength $\lambda_1$ emitted to the outside of the thermal radiation light source 10B also decreases. Similarly, when the second switch 162B is turned ON, the intensity of the light with the wavelength $\lambda_2$ decreases, and when the third switch 163B is turned ON, the intensity of the light with the wavelength $\lambda_3$ decreases. Since the first switch 161B to the third switch 163B can be turned ON and OFF independently, the intensities of the lights with the wavelengths $\lambda_1$, $\lambda_2$, and $\lambda_3$ emitted to the outside of the thermal radiation light source 10B can be controlled independently.

Figure 9:
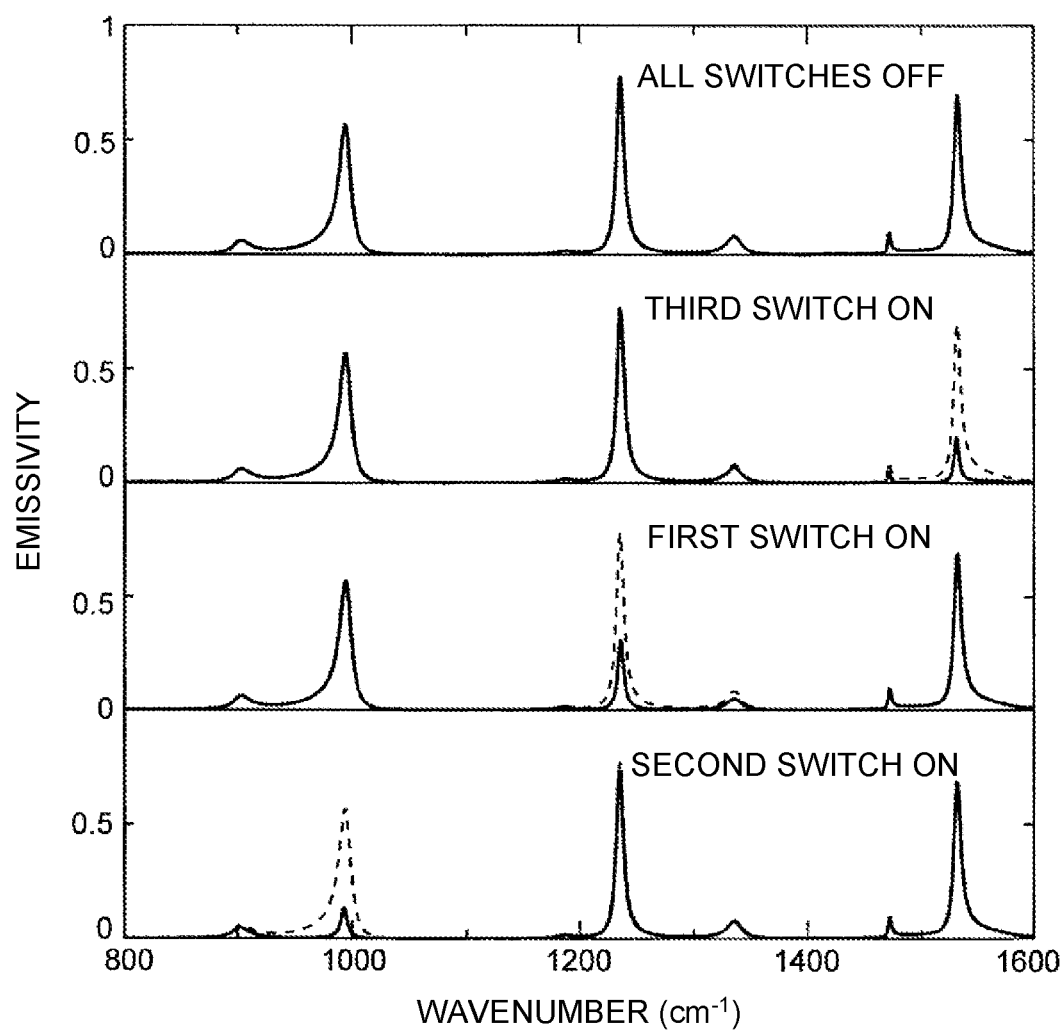
FIG. 9 is a graph showing calculation results regarding thermal radiation spectrum of the thermal radiation light source of the second embodiment.

(2-3) Calculation Results Regarding the Thermal Radiation Light Source of the Second Embodiment FIG. 9 is a graph showing calculation results regarding thermal radiation spectrum of the thermal radiation light source 10B of the second embodiment. When all of the first switch 161B to the third switch 163B are OFF, peaks are observed at wavenumbers of about 970 cm$^{-1}$ (corresponding to the resonance wavelength $\lambda_2$), about 1230 cm$^{-1}$ (corresponding to the resonance wavelength $\lambda_1$), and about 1530 cm$^{-1}$ (corresponding to the resonance wavelength $\lambda_3$). When the first switch 161B is turned ON, the peak intensity at the wavenumber of about 1230 cm$^{-1}$ decreases. Similarly, when the second switch 162B is turned ON, the peak intensity at the wavenumber of about 970 cm$^{-1}$ decreases, and when the third switch 163B is turned ON, the peak intensity at the wavenumber of about 1530 cm$^{-1}$ decreases. From this result, it can be assured that the intensities of lights of three wavelengths (wavenumbers) are independently controllable by switching ON/OFF of the first switch 161B to the third switch 163B.

(3) Others

The case where two or three quantum well structure layers having different transition energies between subbands are employed has been described as an example. Even in the case of four or more layers, by designing a photonic crystal portion in which lights having wavelengths corresponding to the transition energies of the quantum well structure layers resonate, a thermal radiation light source capable of independently controlling the intensities of lights with four or more wavelengths can be provided.

Although the example in which the photonic crystal portion is provided in the laminated body has been described so far, a photonic crystal portion may be provided adjacent to the laminated body, that is, outside the laminated body. A thermal radiation light source 10C shown in FIG. 10 is provided with a photonic crystal portion 20C which is adjacent to the surface of the first n-layer 121 which is on the outer side of the laminated body 10S, and in which holes 22C (different refractive index regions) are periodically disposed in a base material 21C. No holes are provided in the laminated body 10S. As in the holes 22 in the first embodiment, the holes 22C may be disposed in a triangular lattice pattern (see FIG. 1. (b)), or another arrangement such as a square lattice pattern may be employed. The material of the base material 21C is not particularly limited. However, for example, the same material as that of the n-layer, the i-layer or the p-layer in the laminated body 10S can be used, and in particular from the viewpoint of preventing unnecessary light emission derived from free carrier absorption, the same material as that of the i-layer can be preferably used.

In a thermal radiation light source 10D shown in FIG. 11, different refractive index members 23, which are columnar members, perpendicularly extending from the surface of the first n-layer 121 which is disposed on the outer side of the laminated body 10S are periodically disposed. The different refractive index members 23 and the air around the different refractive index members 23 constitute a photonic crystal portion 20D. In the example shown in FIG. 11(b), the different refractive index members 23 are disposed in a triangular lattice pattern, but other arrangements such as a square lattice pattern may be employed.

As in the operation of the thermal radiation light source 10 of the first embodiment, in both of the thermal radiation light source 10C and the thermal radiation light source 10D, light emission with a bandwidth including a target wavelength according to ON/OFF of the first switch 161 and the second switch 162 occurs in the first quantum well structure layer 111 and/or the second quantum well structure layer 112. The light having the target wavelength resonates and is amplified in the photonic crystal portions 20C and 20D, and is emitted to the outside.

REFERENCE SIGNS LIST 10, 10A, 10B, 10C, 10D . . . Thermal radiation light source
10S, 10SB . . . Laminated Body
111, 111B . . . First Quantum Well Structure Layer
112, 112B . . . Second Quantum Well Structure Layer
113B . . . Third Quantum Well Structure Layer
121, 121B . . . First n-layer
122, 122B . . . Second n-layer
13 . . . p-Layer
131B . . . First p-layer
132B . . . Second p-layer
141, 141B . . . First i-layer
142, 142B . . . Second i-layer
143B . . . Third i-layer
151, 151A, 151B . . . First Power Supply
152, 152A, 152B . . . Second Power Supply
153B . . . Third Power Supply
161, 161A, 161B . . . First Switch
162, 162A, 162B . . . Second Switch
163B . . . Third Switch
17 . . . Control Unit
20, 20B, 20C, 20D . . . Photonic Crystal Portion
21, 21B, 21C . . . Base Material
22, 22B, 22C . . . Hole
23 . . . Different Refractive Index Member

The invention claimed is:

1. A thermal radiation light source comprising:
a) a laminated body including m quantum well structure layers that are laminated, that each have a quantum well structure, and that have different magnitudes of transition energy between subbands respectively where m is an integer of 2 or more, and including an n-layer and a p-layer sandwiching each of the quantum well structure layers from both sides in the laminating direction wherein the n-layer is made of an n-type semiconductor and the p-layer is made of a p-type semiconductor;
b) a voltage applying unit that is provided for each of the m quantum well structure layers and is directly or indirectly connected to the n-layer and the p-layer sandwiching each quantum well structure layer and that applies a voltage for moving a charge in a quantum well of each quantum well structure layer to the n-layers or the p-layer;
c) a voltage switching unit that switches ON/OFF of application of the voltage to each of the m quantum well structure layers; and
d) a photonic crystal portion disposed in the laminated body or adjacent to the laminated body, and including a periodic refractive index distribution having a single period so that lights of a total of m kinds of wavelengths resonate, each of the lights of the m wavelengths being generated in each of the m quantum well structure layers corresponding to transition energy between subbands in the quantum well of the quantum well structure layer.

2. The thermal radiation light source according to claim 1, wherein the m is 2.

3. The thermal radiation light source according to claim 1, wherein the laminated body and the photonic crystal portion are integrally formed.

4. The thermal radiation light source according to claim 3, wherein the photonic crystal portion is constructed by the laminated body and holes, the holes being provided in the laminating direction so as to penetrate the layers of the laminated body, and disposed periodically in a direction parallel to the quantum well structure layer, the n-layers and the p-layer.

5. The thermal radiation light source according to claim 1,
wherein the laminated body is constructed by a first semiconductor layer, a first quantum well structure layer which is a first one of the quantum well structure layers, a second semiconductor layer, a second quantum well structure layer which is a second one of the quantum well structure layers, and a third semiconductor layer in this order,
wherein the first semiconductor layer and the third semiconductor layer are any one of the n-layer and the p-layer, and the second semiconductor layer is one of the n-layer and the p-layer different from the one that serves as the first semiconductor layer and the third semiconductor layer, and
wherein the voltage applying unit is connected to the first semiconductor layer and the third semiconductor layer.

6. The thermal radiation light source according to claim 1, wherein the m kinds of wavelengths are a resonance wavelength of a fundamental mode and a resonance wavelength of one or more higher-order modes of the photonic crystal portion, or a resonance wavelength of a plurality of higher-order modes of the photonic crystal portion.

7. The thermal radiation light source according to claim 6, wherein the m kinds of wavelengths are the resonance wavelength of the fundamental mode and a resonance wavelength of a first higher-order mode of the photonic crystal portion.

8. The thermal radiation light source according to claim 1, wherein the photonic crystal portion includes a different refractive index region which is a region having a refractive index different from a refractive index of a plate member, the different refractive index region being arranged in a triangular lattice pattern or a square lattice pattern on the plate member.

9. A thermal radiation light source element comprising:
a) a laminated body including m quantum well structure layers that are laminated, that each have a quantum well structure, and that have different magnitudes of transition energy between subbands respectively where m is an integer of 2 or more, and including an n-layer and a p-layer sandwiching each of the quantum well structure layers from both sides in the laminating direction wherein the n-layer is made of an n-type semiconductor and the p-layer is made of a p-type semiconductor; and
b) a photonic crystal portion disposed in the laminated body or adjacent to the laminated body, and including a periodic refractive index distribution having a single period so that lights of a total of m kinds of wavelengths resonate, each of the lights of the m wavelengths being generated in each of the m quantum well structure layers corresponding to the transition energy.

10. The thermal radiation light source element according to claim 9, wherein the m is 2.

11. The thermal radiation light source element according to claim 9, wherein the laminated body and the photonic crystal portion are integrally formed.

12. The thermal radiation light source element according to claim 9, wherein the photonic crystal portion is constructed by the laminated body and holes, the holes being provided in the laminating direction so as to penetrate the layers of the laminated body, and disposed periodically in a direction parallel to the quantum well structure layer, the p-layers and the p-layer.

13. The thermal radiation light source element according to claim 9, wherein the laminated body is constructed by a first semiconductor layer, a first quantum well structure layer which is a first one of the quantum well structure layers, a second semiconductor layer, a second quantum well structure layer which is a second one of the quantum well structure layers, and a third semiconductor layer in this order, and
wherein the first semiconductor layer and the third semiconductor layer are any one of the n-layer and the p-layer, and the second semiconductor layer is one of the n-layer and the p-layer, the one being different from the one that serves as the first semiconductor layer and the third semiconductor layer.

14. The thermal radiation light source element according to claim 9, wherein the m kinds of wavelengths are a resonance wavelength of a fundamental mode and a resonance wavelength of one or more higher-order modes of the photonic crystal portion, or a resonance wavelength of a plurality of higher-order modes of the photonic crystal portion.

15. The thermal radiation light source element according to claim 14, wherein the m kinds of wavelengths are the resonance wavelength of the fundamental mode and a resonance wavelength of a first higher-order mode of the photonic crystal portion.

16. The thermal radiation light source element according to claim 9, wherein the photonic crystal portion includes a different refractive index region which is a region having a refractive index different from a refractive index of a plate member, the different refractive index region being arranged in a triangular lattice pattern or a square lattice pattern on the plate member.

* * * * *